(12) United States Patent
Shinohara

(10) Patent No.: US 9,793,314 B2
(45) Date of Patent: Oct. 17, 2017

(54) IMAGING APPARATUS, IMAGING SYSTEM AND MANUFACTURING METHOD OF IMAGING APPARATUS

(71) Applicant: CANON KABUSHIKI KAISHA, Tokyo (JP)

(72) Inventor: Mahito Shinohara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 129 days.

(21) Appl. No.: 14/579,000

(22) Filed: Dec. 22, 2014

(65) Prior Publication Data

US 2015/0179699 A1 Jun. 25, 2015

(30) Foreign Application Priority Data

Dec. 25, 2013 (JP) .................. 2013-267137

(51) Int. Cl.
*H01L 31/0352* (2006.01)
*H01L 27/00* (2006.01)
*H01L 27/146* (2006.01)

(52) U.S. Cl.
CPC .. *H01L 27/14679* (2013.01); *H01L 27/14689* (2013.01)

(58) Field of Classification Search
CPC ......... H01L 27/14678; H01L 27/14689; H01L 27/14818; H01L 27/146
See application file for complete search history.

(56) References Cited

U.S. PATENT DOCUMENTS

| 2005/0156264 A1 | 7/2005 | Sakano |
| 2006/0071210 A1* | 4/2006 | Yamazaki ........... H01L 27/1214 257/57 |

FOREIGN PATENT DOCUMENTS

| CN | 1496112 A | 5/2004 |
| CN | 101471353 A | 7/2009 |
| CN | 102446939 A | 5/2012 |
| JP | S62-098779 A | 5/1987 |
| JP | 2006-196789 A | 7/2006 |
| JP | 2007-165736 A | 6/2007 |

* cited by examiner

*Primary Examiner* — Mohammad Choudhry
(74) *Attorney, Agent, or Firm* — Canon USA, Inc. IP Division

(57) ABSTRACT

One embodiment provides an imaging apparatus including a photoelectric conversion unit; and a junction type field effect transistor configured to output a signal based on a carrier generated by the photoelectric conversion unit. The junction type field effect transistor includes a semiconductor region of a first conductivity type that forms a channel and a gate region of a second conductivity type. The semiconductor region of the first conductivity type includes a first region and a second region. The first region and the second region are disposed in this order toward a direction to which a carrier in the channel drifts. An impurity density of the second region is lower than an impurity density of the first region.

12 Claims, 11 Drawing Sheets

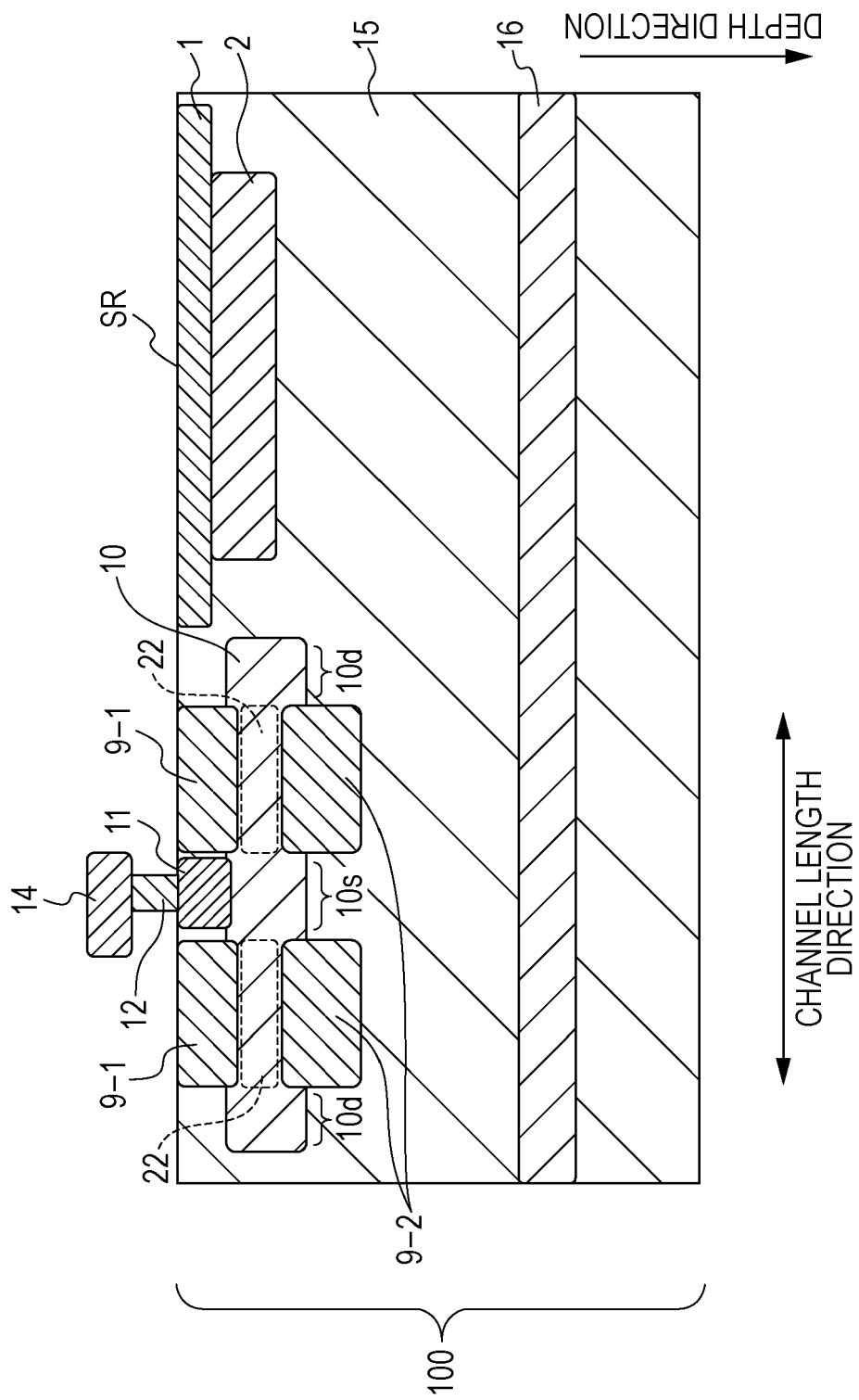

IMAGING APPARATUS, IMAGING SYSTEM AND MANUFACTURING METHOD OF IMAGING APPARATUS

BACKGROUND OF THE INVENTION

Field of the Invention

The present disclosure relates to imaging apparatus, imaging systems and manufacturing methods of imaging apparatus.

Description of the Related Art

An imaging apparatus which utilizes Junction type Field Effect Transistors has been proposed. Japanese Patent Laid-Open No. 2007-165736 describes an imaging apparatus including a plurality of pixels. Each pixel includes a Junction type Field Effect Transistor. In the Junction type Field Effect Transistor described in Japanese Patent Laid-Open No. 2007-165736, a channel region is sandwiched between a surface gate region and a buried gate region. The channel region is connected to a drain region at the end portion of the buried gate region.

SUMMARY OF THE INVENTION

According to an aspect of the present disclosure, an imaging apparatus is provided. The imaging apparatus includes a photoelectric conversion unit; and a junction type field effect transistor configured to output a signal based on a carrier generated by the photoelectric conversion unit. The junction type field effect transistor includes a semiconductor region of a first conductivity type that forms a channel. The junction type field effect transistor includes a gate region of a second conductivity type. The semiconductor region of the first conductivity type includes a first region and a second region. The first region and the second region are arranged in this order toward a direction to which a carrier in the channel drifts. An impurity density of the second region is lower than an impurity density of the first region.

According to another aspect of the present disclosure, an imaging apparatus is provided. The imaging apparatus includes a photoelectric conversion unit; and a junction type field effect transistor configured to output a signal based on a carrier generated by the photoelectric conversion unit. The junction type field effect transistor includes a semiconductor region of a first conductivity type that forms a channel. The junction type field effect transistor includes a gate region of a second conductivity type. In at least a part of the semiconductor region of the first conductivity type, an impurity density profile is formed such that the impurity density varies lower as a position goes toward a direction to which a carrier in the channel drifts.

According to another aspect of the present disclosure, an imaging apparatus is provided. The imaging apparatus includes a photoelectric conversion unit; and a junction type field effect transistor configured to output a signal based on a carrier generated by the photoelectric conversion unit. The junction type field effect transistor includes a channel region of a first conductivity type, a source region of the first conductivity type, a drain region of the first conductivity type and a gate region of a second conductivity type. The channel region includes a first region and a second region. The first region and the second region are arranged in this order from the source region to the drain region. An impurity density of the second region is lower than an impurity density of the first region.

According to another aspect of the present disclosure, an imaging apparatus is provided. The imaging apparatus includes a photoelectric conversion unit; and a junction type field effect transistor configured to output a signal based on a carrier generated by the photoelectric conversion unit. The junction type field effect transistor includes a channel region of a first conductivity type, a source region of the first conductivity type, a drain region of the first conductivity type and a gate region of a second conductivity type. In at least a part of the channel region, an impurity density profile is formed such that the impurity density becomes lower as a position goes from the source region to the drain region.

According to another aspect of the present disclosure, an imaging apparatus is provided. The imaging apparatus includes a photoelectric conversion unit; and a junction type field effect transistor configured to output a signal based on a carrier generated by the photoelectric conversion unit. The junction type field effect transistor includes a channel region of a first conductivity type, a source region of the first conductivity type, a drain region of the first conductivity type and a gate region of a second conductivity type. An impurity density of the drain region is lower than an impurity density of the channel region.

According to another aspect of the present disclosure, an imaging system is provided. An imaging system includes the imaging apparatus described above and a signal processing unit configured to process a signal output from the imaging apparatus.

According to another aspect of the present disclosure, a manufacturing method of an imaging apparatus is provided. The imaging apparatus includes a photoelectric conversion unit; and a junction type field effect transistor configured to output a signal based on a carrier generated by the photoelectric conversion unit. The manufacturing method includes a step of forming a semiconductor region of a first conductivity type and a gate region of the junction type field effect transistor which has a second conductivity type and is arranged at a different depth from the semiconductor region of the first conductivity type. The semiconductor region of the first conductivity type and the gate region are formed by doping the semiconductor substrate with impurities using a first mask which defines a first opening. The manufacturing method includes a step of forming a channel region of the junction type field effect transistor which has the first conductivity type, by doping the semiconductor substrate with an impurity using a second mask which defines a second opening. A region which is doped with the impurity when forming the semiconductor region of the first conductivity type overlaps with a region which is doped with the impurity when forming the channel region. An orthogonal projection of a first part of the second opening onto a plane parallel to a surface of the semiconductor substrate overlaps with an orthogonal projection of the first opening onto the plane. An orthogonal projection of a second part, which is different from the first part, of the second opening onto the plane overlaps with an orthogonal projection of the first mask onto the plane.

Further features of the present disclosure will become apparent from the following description of exemplary embodiments with reference to the attached drawings.

BRIEF DESCRIPTION OF THE DRAWINGS

FIG. 2 is a diagram schematically illustrating a cross sectional structure of an imaging apparatus.

DESCRIPTION OF THE EMBODIMENTS

Figure 1:
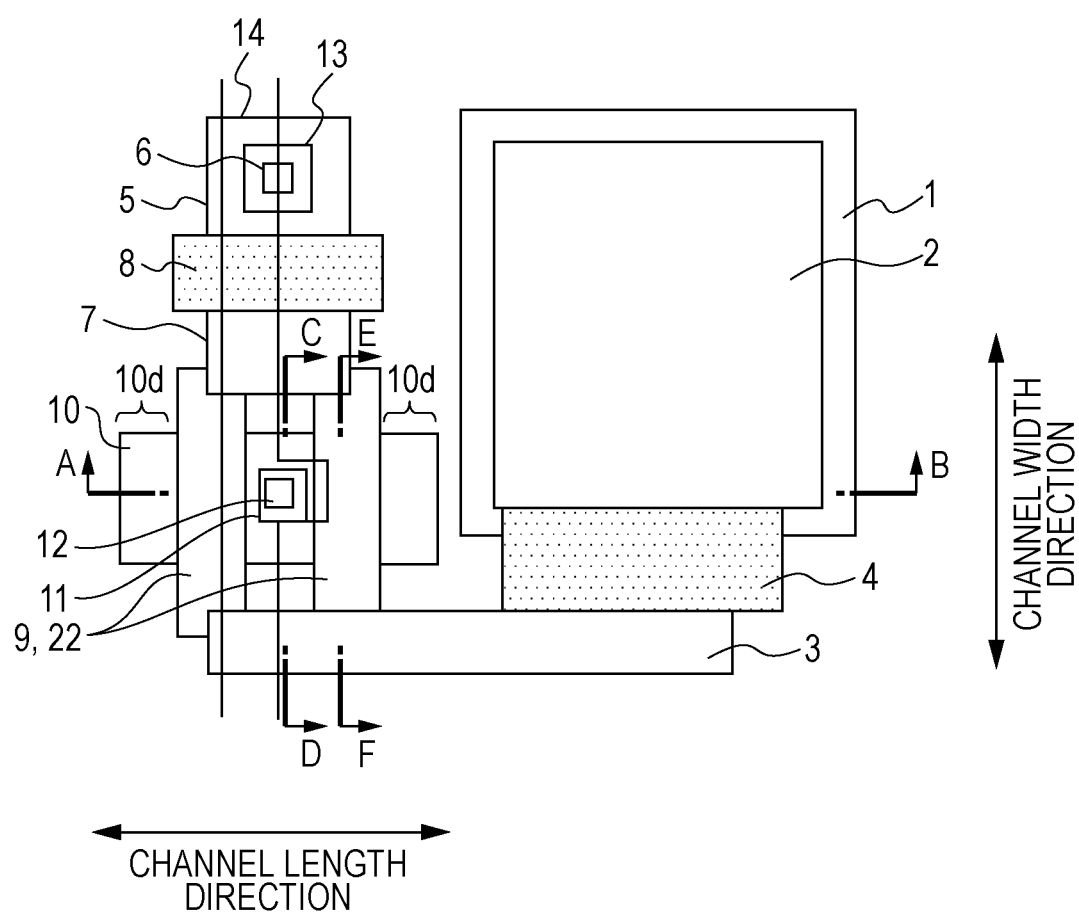
FIG. 1 is a diagram schematically illustrating a planar structure of an imaging apparatus.

According to some embodiments of the present disclosure, noises may be reduced.

In a Junction type Field Effect transistor known to the inventor, when the current runs through a channel of the Junction type Field Effect Transistor, a large electric field may be generated in the vicinity of a drain of the Junction type Field Effect Transistor. The large electric field may cause impact-ionization, and thus, may generate carriers. The generated carriers may run into a gate region of the Junction type Field Effect Transistor, whereby a noise may be generated.

Some embodiments of the present disclosure provide an imaging apparatus including a Junction type Field Effect Transistor where noises may be reduced.

An embodiment of the present disclosure provides an imaging apparatus including a plurality of pixels. Each pixel includes a Junction type Field Effect Transistor (hereinafter, referred to as JFET). The JFET includes a gate region, a channel region, a drain region and a source region, respectively formed in a semiconductor substrate. In the JFET, a conductivity type of the gate region is different from conductivity types of the channel region, the drain region and the source region.

In the present embodiment, the imaging apparatus utilizes a lateral JFET where a direction of channel current is parallel to the surface of the semiconductor substrate. Therefore, the drain region and the channel region are arranged, located, positioned, or disposed adjacently to each other when viewed in a planar view. In the present specification, when it refers to arrangements, positions or shapes of members when viewed in a planar view, or just in a planar view, it means arrangements, positions or shapes of orthogonal projections of the members which are vertically projected onto a plane parallel to the surface of the semiconductor substrate. Thus, an orthogonal projection of the drain region onto a plane parallel to the surface of the semiconductor substrate and an orthogonal projection of the channel region onto the plane are adjacent to each other. The surface of the semiconductor substrate is defined as an interface between a semiconductor region and an insulator. The projection may be a shadow of an object which is produced on a plane when the object is exposed to parallel rays which are vertical to the plane.

Embodiments according to the present disclosure are featured in a impurity density profile, or impurity distribution, of a semiconductor region having a first conductivity type that forms a channel of the JFET. The semiconductor region that forms the channel is defined as a region to be a path of the channel current of the JFET. The semiconductor region having the first conductivity type includes a first region and a second region which has a lower impurity density than a impurity density of the first region. The first region and the second region are arranged, located, positioned, or disposed in this order toward a direction to which a carrier in the channel drifts. In another aspect, in at least a part of the semiconductor region having the first conductivity type that forms the channel of the JFET, an impurity density profile, or impurity distribution, is formed such that the impurity density is getting lower as it goes toward a direction to which a carrier in the channel drifts.

In some embodiments, the semiconductor region that forms the channel includes a channel region, a drain region and a source region. In these embodiments, an impurity density of the drain region is lower than an impurity density of the channel region. Or, in these embodiments, in at least a part of the channel region, an impurity density profile, or impurity distribution, is formed such that the impurity density is getting lower as it goes from the source region to the drain region.

Embodiments where the first conductivity type is an N-type, includes a JFET having an N-type channel region. In this case, the carrier means an electron. The electron drifts toward a direction where a voltage is getting high. Embodiments where the first conductivity type is a P-type, includes a JFET having a P-type channel region. In this case, the carrier means a hole. The hole drifts toward a direction where a voltage is getting low.

According to the above described configuration, an electric field in a pinch off region generated near the drain region can be alleviated. Accordingly, generation of carriers due to impact-ionization may be reduced. As a result, noises may be reduced.

Hereinafter, embodiments of the present disclosure will be described in detail with reference to the appended drawing. The present disclosure is not restricted to embodiments alone that will be described below. Also, examples in which a partial configuration of one of the following embodiments is added to another embodiment or replaced with a partial configuration of another embodiment are also embodiments of the present disclosure.

In embodiments to be described, the gate region is of P-type, and the channel region, the drain region and the source region are of N-type. The present disclosure includes embodiments where the conductivity type of each semiconductor region is reversed.

First Embodiment

FIG. 1 is a diagram schematically illustrating a planar structure of an imaging apparatus of the present embodiment. FIG. 1 illustrates one pixel. The pixel includes a photoelectric conversion unit such as a photodiode, a transfer transistor, a reset transistor and a JFET. The imaging apparatus of the present embodiment includes a plurality of the pixel illustrated in FIG. 1.

In the present embodiment, the photoelectric conversion unit is a photodiode. The photodiode includes an N-type semiconductor region 1 formed in the surface of the semiconductor substrate and a P-type semiconductor region 2 formed under the N-type semiconductor region 1. The N-type semiconductor region 1 and the P-type semiconductor region 2 form a P-N junction. A hole generated by incident light is accumulated in the P-type semiconductor region 2 as a signal charge. The signal charge accumulated in the P-type semiconductor region 2 is transferred to a floating diffusion region 3 (hereinafter, referred to as FD region 3). The FD region 3 is a P-type semiconductor region. A transfer gate electrode 4 transfers the signal charge from the P-type semiconductor region 2 to the FD region 3.

The JFET includes a P-type gate region 9, an N-type channel region 10, an N-type semiconductor region 22 and an N-type source region 11. The channel region 10 and the N-type semiconductor region 22 intersect each other when viewed in a planar view. As illustrated in FIG. 2 which will be explained later, the channel region 10 and the N-type semiconductor region 22 are arranged, located, positioned, or disposed at the same depth, at least partially. Thus, an N-type semiconductor region having a cross shape in a planar view is provided at a certain depth.

In the present specification, the N-type semiconductor region having the cross shape is distinguished into the channel region 10 and the N-type semiconductor region 22 for descriptive purpose. An intersectional part of the N-type semiconductor region having the cross shape is the channel region 10 and is the N-type semiconductor region 22. In the present specification, when referring to this regard, it will be described that "at least a part of the N-type semiconductor region 22 is included in the channel region 10". In other words, the N-type semiconductor region includes a part included in the channel region 10 and a part which is not included in the channel region 10.

The part of the N-type semiconductor region 22 which is included in the channel region 10 is defined as a part of the channel region 10 which has a higher impurity density than the other part has. In the present embodiment, an impurity density of the part of the N-type semiconductor region 22 which is included in the channel region 10 is higher than an impurity density of the other part of the N-type semiconductor region 22, i.e. the part which is not included in the channel region 10.

At least a part of the channel region 10 and at least a part of the N-type semiconductor region 22 provide a region to be a path of the channel current of the JFET. Specifically, the channel controlled by the gate region 9 is formed in a portion which overlaps with the gate region 9 when viewed in a planar view. The channel is formed at least in the part of the N-type semiconductor region 22 which is included in the channel region 10.

The JFET of the present embodiment includes a plurality of the gate regions 9. The channel region 10 intersects each of the gate regions 9 when viewed in a planar view. The channel region 10 is arranged, located, positioned, or disposed to cross the gate region 9 from the source side to the drain side. A part of the channel region 10 (indicated as region 10d in FIG. 1) forms a drain region of the JFET.

The gate region 9 and the N-type semiconductor region 22 are arranged, located, positioned, or disposed at different depths from each other. The gate region 9 and the N-type semiconductor region 22 overlap with each other at least partially when viewed in a planar view. In the present embodiment, an orthogonal projection of the N-type semiconductor region 22 onto a plane parallel to the surface of the semiconductor substrate 100 is identical to an orthogonal projection of the gate region 9 onto the plane. For example, the gate region 9 and the N-type semiconductor region 22 may be formed by ion implantations using the same mask, whereby the orthogonal projections of the gate region 9 and the N-type semiconductor region 22 may be identical to each other. Even though using the same mask, if different impurities are used to form the gate region 9 and the N-type semiconductor region 22, there may be differences in diffusion length. Accordingly, even though using the same mask, the orthogonal projections of the gate region 9 and the N-type semiconductor region 22 is not necessarily identical to each other.

An impurity density of the source region 11 is higher than an impurity density of the channel region 10. The source region 11 is electrically connected to an output line 14 via a contact plug 12. The FD region 3 is electrically connected to the gate region 9. In the above described configuration, the JFET outputs a signal based on the voltage of the FD region 3.

The reset MOS (metal oxide semiconductor) transistor includes a P-type drain region 5, a P-type source region 7 and a gate electrode 8. The drain region 5 is electrically connected to a reset drain wiring 13 via a contact plug 6. The source region 7 of the reset MOS transistor is electrically connected to the gate region 9 of the JFET. In the above described configuration, the reset MOS transistor resets the voltage of a gate of the JFET. It may be simple to use an MOS transistor for the reset transistor. Other type of transistors including JFET may be used for the reset transistor.

The JFET of the present embodiment includes a plurality of the gate regions 9 which spread out when viewed in a planar view. The gate regions 9 are arranged, located, positioned, or disposed to sandwich the source region 11 in the planar view. In other words, an orthogonal projection of the source region 11 onto a plane parallel to the surface of the semiconductor substrate is located, in the plane, between orthogonal projections of the gate regions 9 onto the plane. Further, the JFET of the present embodiment includes a plurality of the drain regions. More precisely, the channel region 10 includes a plurality of drain-side portions 10d. Each of the drain regions is arranged, located, positioned, or disposed on opposite side to the source region 10 with respect to corresponding one of the gate regions 9. The channel is formed for each of the gate regions 9. The gate regions 9 may be arranged, located, positioned, or disposed in parallel to each other when viewed in a planar view. The gate regions 9 are electrically connected to each other by a semiconductor region having the same conductivity type as the gate regions 9. In the present embodiment, the FD region 3 and the source region 7 of the reset MOS transistor electrically connect the gate regions 9 to each other.

According to the above described configuration, the effective channel width of the JFET may be widened. That is to say, the drive capability of the JFET may be improved. Thus, the imaging apparatus may operate at a high speed. The JFET may include only a single gate region. Specifically, one of the two gate regions 9 illustrated in FIG. 1 and a corresponding drain region may be removed.

FIG. 2 is a diagram schematically illustrating a cross sectional structure of the imaging apparatus of the present embodiment. FIG. 2 schematically illustrates the cross sectional structure along a line A-B in FIG. 1. Elements of FIG. 2 corresponding to those illustrated in FIG. 1 are designated by the same reference numerals as FIG. 1.

FIG. 2 illustrates a semiconductor substrate 100. An insulator film which is not illustrated is provided on the semiconductor substrate 100. The surface SR of the semiconductor substrate 100 is defined as an interface between the semiconductor substrate 100 and the insulator film which is not illustrated. A channel length direction is defined as a direction which is parallel both to a paper plane of FIG. 2 and to the surface SR.

The photodiode and the JFET are formed in an N-type semiconductor region 15. A drain current (or, channel current) of the JFET is provided by the N-type semiconductor region 15. A drain current providing portion configured to provide the drain current for the N-type semiconductor region 15 is formed in a part of a pixel area or outside the pixel area. The drain current providing portion, for example, includes a contact plug connecting the semiconductor substrate and a wiring.

Under the N-type semiconductor region 15, provided is an N-type semiconductor region 16 which has a higher impurity density than that of the N-type semiconductor region 15. The resistance of the semiconductor substrate 100 may be lowered by the N-type semiconductor region 16. Accordingly, it is possible to reduce a voltage drop due to the drain current provided for the JFET. Thus, it is possible to reduce noises such as shading which occurs because the voltage of the semiconductor substrate varies depending on locations. As a result, image quality may be improved. Otherwise, the drain current may be increased. As a result, the imaging apparatus may operate at a high speed.

The drain-side portion 10d of the channel region 10 may be omitted and a part of the N-type semiconductor region 15 may form the drain region. In this configuration, the impurity density of the N-type semiconductor region 15 is lower than the impurity density pf the N-type semiconductor region 22. The drain region is not limited to the drain-side portion 10d of the channel region 10 and a part of the N-type semiconductor region 15. The drain region may be defined as an N-type semiconductor region which is arranged, located, positioned, or disposed, in a planar view, adjacently to a region where the channel is to be formed.

The gate region 9 includes a surface gate region 9-1 and a buried gate region 9-2. Both of the surface gate region 9-1 and the buried gate region 9-2 are of P-type. The surface gate region 9-1 and the buried gate region 9-2 are arranged, located, positioned, or disposed at different depths from each other. The channel region 10 is arranged, located, positioned, or disposed at a depth between the surface gate region 9-1 and the buried gate region 9-2. A lateral JFET is formed in the above described configuration. In the lateral JFET, the channel length direction is parallel to the surface SR of the semiconductor substrate 100.

The surface gate region 9-1 and the buried gate region 9-2 are electrically connected to each other. A connection portion between the surface gate region 9-1 and the buried gate region 9-2 is arranged, located, positioned, or disposed not to overlap with the channel region 10 when viewed in a planar view. According to the above described configuration, the channel of the JFET may be controlled both by the surface gate region 9-1 and by the buried gate region 9-2.

The surface gate region 9-1 and the buried gate region 9-2 overlap with each other when viewed in a planar view. In other words, an orthogonal projection of the surface gate region 9-1 onto a plane parallel to the surface of the semiconductor substrate is identical to an orthogonal projection of the buried gate region 9-2 onto the plane. In the above described configuration, the surface gate region 9-1 and the buried gate region 9-2 may be formed with the same mask, which is advantageous for reducing fluctuations in a characteristic of the JFET.

The orthogonal projection of the surface gate region 9-1 is not necessary to be identical to the orthogonal projection of the buried gate region 9-2. For example, the surface gate region 9-1, the buried gate region 9-2 and the channel region 10 may be arranged, located, positioned, or disposed such that the surface gate region 9-1 intersects the channel region 10 in a planar view while the buried gate region 9-2 contains completely the channel region 10 in the planar view. In the above described configuration, the surface gate region 9-1 and the buried gate region are formed with different masks.

Either the surface gate region 9-1 or the buried gate region 9-2 may be omitted. In the present embodiment, each of the gate regions 9, which spread out when viewed in a planar view, includes the surface gate region 9-1 and the buried gate region 9-2. However, at least one of the gate regions 9 which spread out in the planar view may have the surface gate region 9-1 or the buried gate region 9-2.

The N-type semiconductor region 22 is arranged, located, positioned, or disposed at a depth between the surface gate region 9-1 and the buried gate region 9-2. In other words, there is a P-N junction between the surface gate region 9-1 and the N-type semiconductor region 22. Also, there is a P-N junction between the buried gate region 9-2 and the N-type semiconductor region 22. The surface gate region 9-1, the buried gate region 9-2 and the N-type semiconductor region 22 may be formed by ion implantations. In that case, the implantation energies used to form the surface gate region 9-1, the buried gate region 9-2 and the N-type semiconductor region 22 may be adjusted so that the N-type semiconductor region 22 is arranged, located, positioned, or disposed at the depth between the surface gate region 9-1 and the buried gate region 9-2.

FIG. 2 illustrates the part of the N-type semiconductor region 22 which is included in the channel region 10. In other words, the region designated as the N-type semiconductor region 22 in FIG. 2 is included in the channel region 10, and has an impurity density higher than that of the other part of the channel region 10. Thus, an impurity density of the drain-side portion 10d of the channel region 10 is lower than the impurity density of the N-type semiconductor region 22. Since the drain of the JFET is applied with a higher voltage than that applied to the source, the electron in the channel drifts from the source-side portion 10s of the channel region 10 toward the drain-side portion 10d. That is, the N-type semiconductor region 22 that has the higher impurity density and the drain-side portion 10d that has the lower impurity density are arranged, located, positioned, or disposed in this order toward a direction to which the electron drifts.

Generally, an impurity density profile, or impurity distribution, in a semiconductor region is not uniform. In that case, impurity densities at peaks of the impurity density profile along the depth direction may be compared with each other. Measurement of the impurity density may be performed by Secondary Ion Mass Spectrometry (SIMS), or the like.

In the present embodiment, a thickness of the N-type semiconductor region 22 is smaller than a thickness of the channel region 10. The thickness of the N-type semiconductor region 22 is smaller than a distance between the surface gate region 9-1 and the buried gate region 902. The thickness of the N-type semiconductor region 22 is not limited in the above relationship.

In the present embodiment, the channel region 10 and the N-type semiconductor region 22 are explained as they are distinguished from each other, for descriptive purpose. Actually, a single N-type semiconductor region may include a plurality of regions having different impurity densities. For example, a single N-type semiconductor region includes a first region which has a higher impurity density corresponding to the N-type semiconductor region 22 and a second region which has a lower impurity density corresponding to the drain-side portion 10d of the channel region 10.

Figure 3A:
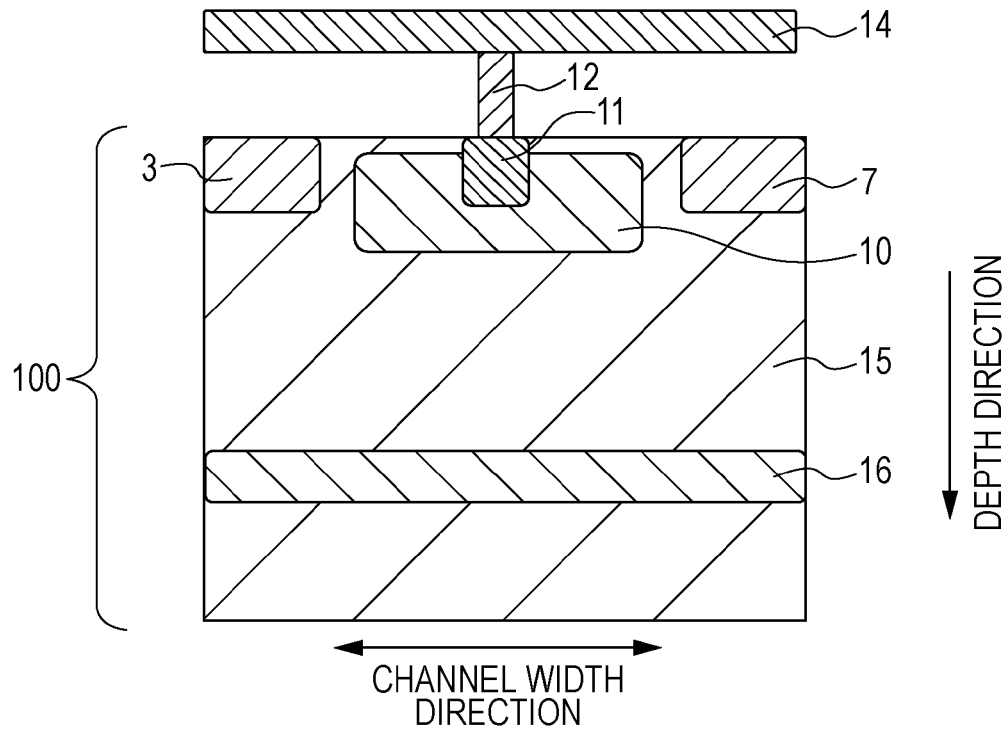
FIG. 3A is a diagram schematically illustrating a cross sectional structure of an imaging apparatus.

FIG. 3A is a diagram schematically illustrating a cross sectional structure of the imaging apparatus of the present embodiment. FIG. 3 schematically illustrates the cross sectional structure along a line C-D in FIG. 1. Elements of FIG. 3A corresponding to those illustrated in FIG. 1 and/or in FIG. 2 are designated by the same reference numerals as FIG. 1 and/or as FIG. 2. A channel width direction is defined as a direction which is parallel both to a paper plane of FIG. 3A and to the surface SR.

As illustrated in FIG. 3A, with respect to a region directly under the source region 11, no P-type semiconductor regions are provided between the channel region 10 and the N-type semiconductor region 15. However, the channel region 10 and the N-type semiconductor region 15 are electrically isolated from each other. Specifically, a depletion region provided by a P-N junction between the two buried gate region 9-2 and the N-type semiconductor region 15 shown in FIG. 2 forms a potential barrier between the channel region 10 and the N-type semiconductor region. The depletion region, or the potential barrier, prevents ohmic conduction between the channel region 10 and the N-type semiconductor region 15. Actually, potential profiles may be designed such that electrical resistance, along a vertical direction to the surface SR, between the channel region 10 and the N-type semiconductor region 15 may be higher than electrical resistance, along the channel length direction, between the source and the drain of the JFET.

Figure 3B:
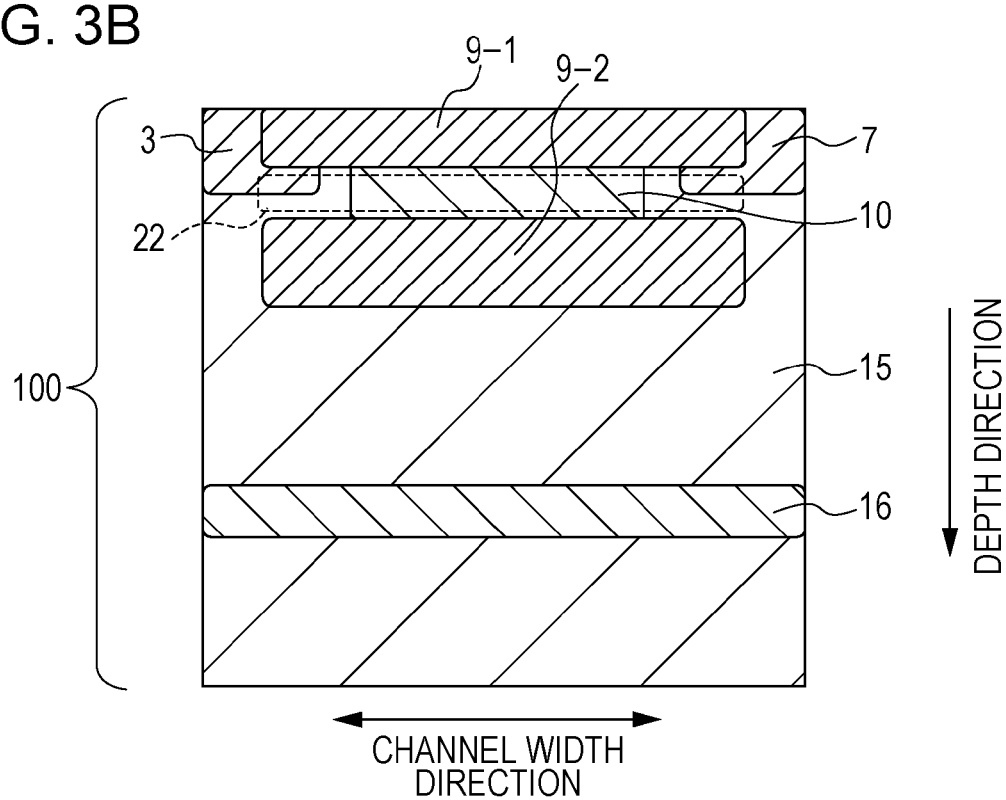
FIG. 3B is a diagram schematically illustrating a cross sectional structure of an imaging apparatus.

FIG. 3B is a diagram schematically illustrating a cross sectional structure of the imaging apparatus of the present embodiment. FIG. 3B schematically illustrates the cross sectional structure along a line E-F in FIG. 1. Elements of FIG. 3B corresponding to those illustrated in any of FIGS. 1 through 3A are designated by the same reference numerals as FIG. 1 through 3A. A channel width direction is defined as a direction which is parallel both to a paper plane of FIG. 3B and to the surface SR.

As mentioned above, the surface gate region 9-1 and the buried gate region 9-2 are electrically connected to each other. In the present embodiment, the region having the same conductivity type electrically connects the surface gate region 9-1 and the buried gate region 9-2. For example, in FIG. 3B, the FD region 3 and the source region 7 of the reset MOS transistor may extend toward deep into the semiconductor substrate to the extent that they may electrically connect the surface gate region 9-1 and the buried gate region 9-2. Although, in FIG. 3, the surface gate region 9-1 and the buried gate region 9-2 are arranged, located, positioned, or disposed with a distance therebetween, the surface gate region 9-1 and the buried gate region 9-2 may be formed, as another variation, in spatially continuously by an impurity diffusion along a vertical direction to the surface SR.

In FIG. 3B, the region where the N-type semiconductor region 22 and either the FD region 3 or the source region 7 of the reset MOS transistor may have either P-type or N-type conductivity.

In the present embodiment, the gate region 9 and the channel region 10 intersect each other in the planar structure illustrated in FIG. 1. In other words, the orthogonal projection of the gate region 9 onto the plane parallel to the surface of the semiconductor substrate and the orthogonal projection of the channel region 10 onto the plane parallel to the surface of the semiconductor substrate intersect each other.

Intersecting of the gate region 9 and the channel region 10 means that each region is arranged, located, positioned, or disposed to cross over the other region. In other words, at least two parts of the gate region 9 protrude out of the channel region 10 and at least two parts of the channel region 10 protrude out of the gate region 9.

A part of the channel region which is arranged, located, positioned, or disposed between the two gate regions 9 when viewed in a planar view of FIG. 1 is defined as a source-side portion 10s of the channel region 10. A part, within the channel region 10, arranged, located, positioned, or disposed on opposite side to the source-side region 10s with respect to the gate region 9 is defined as the drain-side portion 10d of the channel region 10. FIG. 2 also indicates the source-side portion 10s and the drain-side portion 10d, respectively. Each of the source-side portion 10s and the drain-side portion 10d of the channel region 10 does not overlap with the gate region 9. In other words, the source-side portion 10s and the drain-side portion 10d of the orthogonal projection of the channel region 10 respectively protrude out of the orthogonal projection of the gate region 9. Accordingly, as illustrated in FIG. 2, the channel length of the JFET is defined by the end of the gate region 9. As illustrated in FIG. 3B, the channel width of the JFET is defined by the end of the channel region 10.

According to the above described configuration, even though there could be alignment errors between a mask used to form the gate region 9 and a mask used to form the channel region 10, a shape of the channel of the JFET is almost steady, or constant, or unchanged. Thus, fluctuations in the channel length and the channel width of the JFET may be reduced. As a result, fluctuations in the characteristic of the JFET may be reduced.

The reduction of the fluctuation in the electrical characteristic of the JFET may be achieved regardless of the shape of the gate region 9 or the shape of the channel region 10. The reduction of the fluctuation may be obtained because of the structure where the gate region 9 and the channel region intersect each other when viewed in a planar view. A periphery, in a planar view, of the gate region 9 may include two parallel lines along the channel width direction, as illustrated in FIG. 1. In this configuration, the fluctuation in the electrical characteristic may be more reduced. A periphery, in a planar view, of the channel region 10 may include two parallel lines along the channel length direction, as illustrated in FIG. 1. In this configuration, the fluctuation in the electrical characteristic may be more reduced. The gate region 9 and/or the channel region 10 may have rectangular shapes, respectively, so that masks used to form the gate region 9 and the channel region may be simplified. The peripheries of the gate region 9 and the channel region 10 may include curves. In this configuration, fluctuations in the electrical characteristic of the JFET, due to a rotational alignment error, may be reduced.

The channel length of the JFET is defined as a distance between the drain-side end and the source-side end of the gate region 9. The drain-side portion 10d and the source-side portion 10s of the channel region 10 are divided into both sides of the gate region 9 when viewed in a planar view, which leads to the reduction of the fluctuation in the characteristics. In other words, the reduction of the fluctuation in the characteristics may be obtained by that each of the source-side portion 10s and the drain-side portion 10d of the orthogonal projection of the channel region 10 protrudes out of the orthogonal projection of the gate region 9.

Figure 4A:
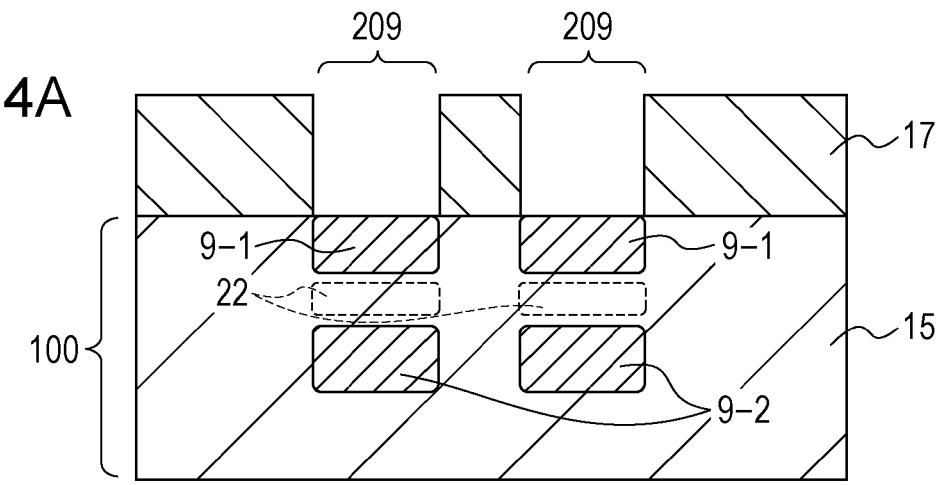
FIGS. 4A-4C are diagrams to explain a manufacturing method of an imaging apparatus.
Figure 4B:
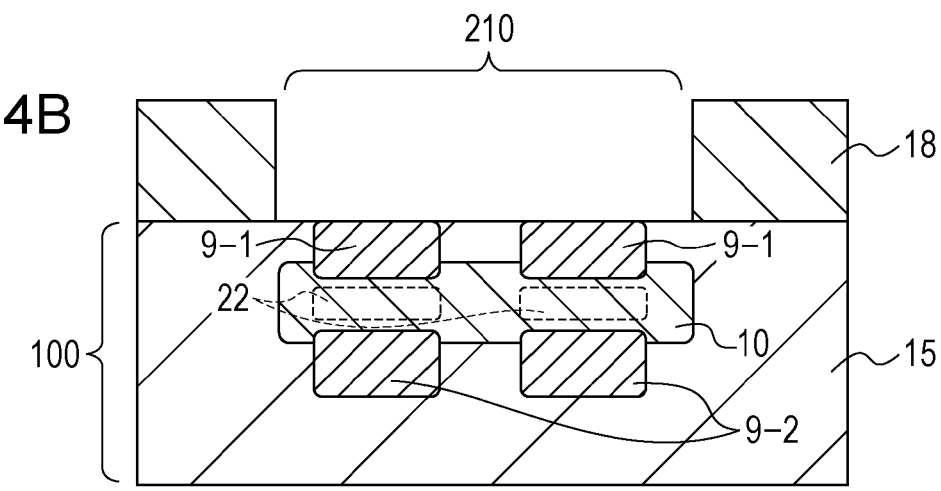
Figure 4C:
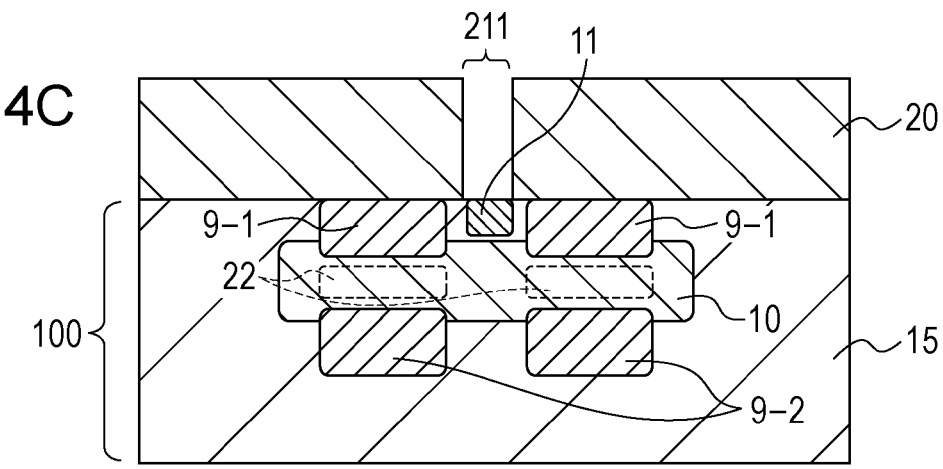

Hereinafter, an example of a manufacturing method of the imaging apparatus of the present embodiment will be explained. FIGS. 4A-4C are diagrams used to explain the manufacturing method of the imaging apparatus of the present embodiment. Each of FIGS. 4A-4C schematically illustrates a cross sectional structure along a line A-B in FIG. 1. Elements of FIGS. 4A-4C corresponding to those illustrated in any of FIGS. 1 through 3B are designated by the same reference numerals as FIGS. 1 through 3B.

In a step illustrated in FIG. 4A, the gate region 9 of the JFET and the N-type semiconductor region 22 are formed. In this step, a first mask 17 which defines a first opening 209 is used. The first mask 17 is, for example, obtained by patterning a photoresist by photolithography method.

Impurities to be acceptors, such as boron, are doped into the semiconductor substrate 100 through the first opening 209, whereby the gate region 9 is formed in a region corresponding to the first opening 209. For example, the gate region 9 may be formed by an ion implantation using the first mask 17. By performing a plurality of ion implantations at different implantation energies, the surface gate region 9-1 and the buried gate region 9-2 may be formed at different depths from each other. Generally, a higher energy is used to form a semiconductor region at a deeper position in the semiconductor substrate 100. According to the implantation energies, the surface gate region 9-1 and the buried gate region 9-2 may be formed in spatially continuously by an impurity diffusion along a vertical direction to the surface SR.

In the present embodiment, an N-type semiconductor region 22 is formed using the first mask 17 which has been used or is to be used to form the surface gate region 9-1 and the buried gate region 9-2. Impurities to be donors, such as phosphorus and arsenic, are doped into the semiconductor substrate 100 through the first opening 209, whereby the N-type semiconductor region 22 is formed in a region corresponding to the first opening 209. The surface gate region 9-1, the buried gate region 9-2 and the N-type semiconductor region 22 may be formed by ion implantations. In that case, the implantation energies used to form the surface gate region 9-1, the buried gate region 9-2 and the N-type semiconductor region 22 may be adjusted so that the N-type semiconductor region 22 is arranged, located, positioned, or disposed at the depth between the surface gate region 9-1 and the buried gate region 9-2.

In the present embodiment, a region into which impurities are doped when forming the surface gate region 9-1 and the buried gate region 9-2 does not overlap with a region into which impurities are doped when forming the N-type semiconductor region 22. Accordingly, the thickness of the N-type semiconductor region 22 is smaller than the distance between the surface gate region 9-1 and the buried gate region 9-2.

Figure 10A:
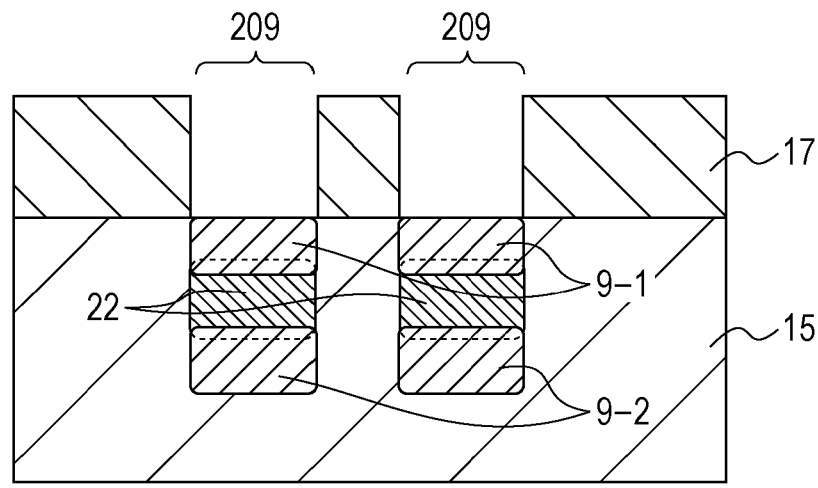
FIGS. 10A-10C are diagrams to explain a manufacturing method of an imaging apparatus.
Figure 10B:
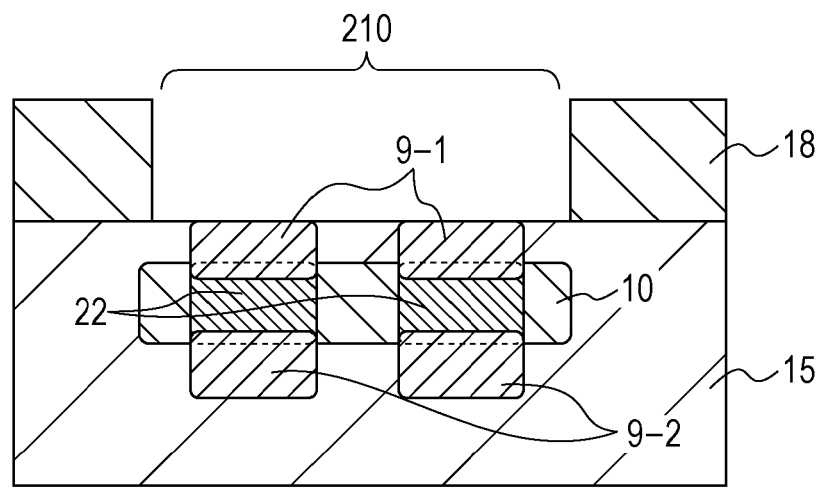
Figure 10C:
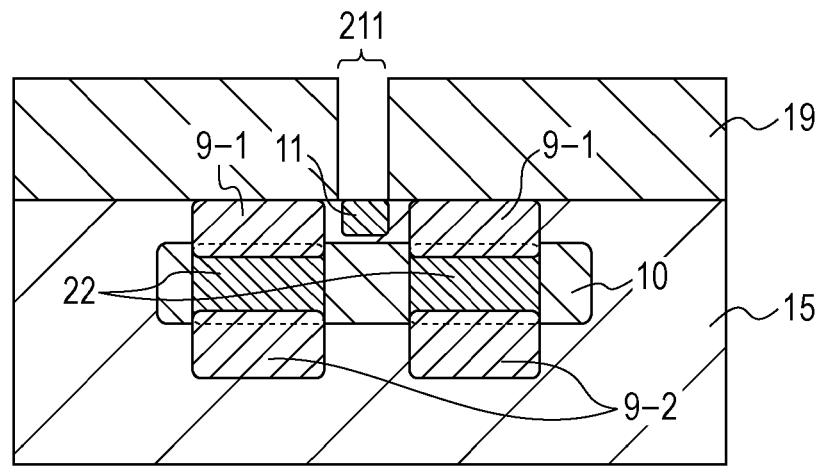

However, in some embodiments, the region into which impurities are doped when forming the surface gate region 9-1 and the buried gate region 9-2 may overlap with the region into which impurities are doped when forming the N-type semiconductor region 22. Those embodiments are illustrated in FIGS. 10A-10C. Each of FIGS. 10A-10C illustrates a schematic cross sectional structure of an imaging apparatus according to the embodiments. Elements of FIGS. 10A-10C corresponding to those illustrated in any of FIGS. 4A-4C are designated by the same reference numerals as FIGS. 4A-4C.

In a step illustrated in FIG. 4B, the channel region 10 of the JFET is formed. In this step, a second mask 18 which defines a second opening 210 is used. The second mask 18 is, for example, obtained by patterning a photoresist by photolithography method.

Impurities to be donors, such as phosphorus and arsenic, are doped into the semiconductor substrate 100 through the second opening 210, whereby the channel region 10 is formed in a region corresponding to the second opening 210. For example, the channel region 10 may be formed by an ion implantation using the second mask 18. The implantation energy used to form the channel region 10 may be adjusted so that the channel region 10 is formed at a depth between the surface gate region 9-1 and the buried gate region 9-2. After forming the channel region 10, the second mask 18 is removed.

In the present embodiment, the thickness of the N-type semiconductor region 22 is smaller than the thickness of the channel region 10. However, the relationship in the thicknesses of the N-type semiconductor region 22 and the channel region 10 is not limited to those of the present embodiment. For example, the thickness of the N-type semiconductor region 22 may the same as the thickness of the channel region 10 as illustrated in FIG. 10B. As not illustrated, the thickness of the N-type semiconductor region 22 is larger than the thickness of the channel region 10. After forming the channel region 10, the second mask 18 is removed.

The region where the channel region 10 and the N-type semiconductor region 22 are superposed is doped with impurities twice: in the two steps of forming the channel region 10 and of forming the N-type semiconductor region 22. On the other hand, the drain-side region 10d of the channel region 10 is not doped with impurities to be donors during the step of forming the N-type semiconductor region 22. Accordingly, the part, which has not been doped with impurities when forming the N-type semiconductor region 22, of the channel region 10, i.e. the drain-side region 10d has a relatively low impurity density compared to the N-type semiconductor region 22. According to the above described method, it is possible to make the impurity density of the drain-side portion 10d of the channel region 10 lower.

Although it is not shown in FIG. 4, a P-type semiconductor region that electrically connects the plurality of the gate regions 9 to each other may be formed using a third mask 19 which defines third openings 203 and 207. The third mask 19 is, for example, obtained by patterning a photoresist by photolithography method.

In the present embodiment, the FD region 3 and the source region 7 of the reset MOS transistor are formed using the third mask 19. These regions electrically connect the gate regions 9 to each other. After forming the P-type semiconductor region that electrically connects the plurality of the gate regions 9 to each other, the third mask 19 is removed.

In a step illustrated in FIG. 4C, the source region 11 which is connected to the source-side portion 10s of the channel region 10 is formed. In this step, a mask 20 which defines an opening 211 is used. The mask 20 is a hard mask. The mask 20 includes an insulator film made of an inorganic material such as silicon oxide, silicon nitride, and silicon oxy-nitride.

Impurities to be donors, such as phosphorus and arsenic, are doped into the semiconductor substrate 100 through the opening 211, whereby the source region 11 is formed in a region corresponding to the opening 211.

The mask 20 may be used as an interlayer insulation film, when the hard mask is used as the mask 20 as mentioned above. Specifically, after forming the source region 11, the mask 20 remains not to be removed, and then, the contact plug 12 electrically connected to the source region 11 is formed in the opening 211. Thereafter, the output line 14 connected to the contact plug 12 is formed on the mask 20.

Figure 5A:
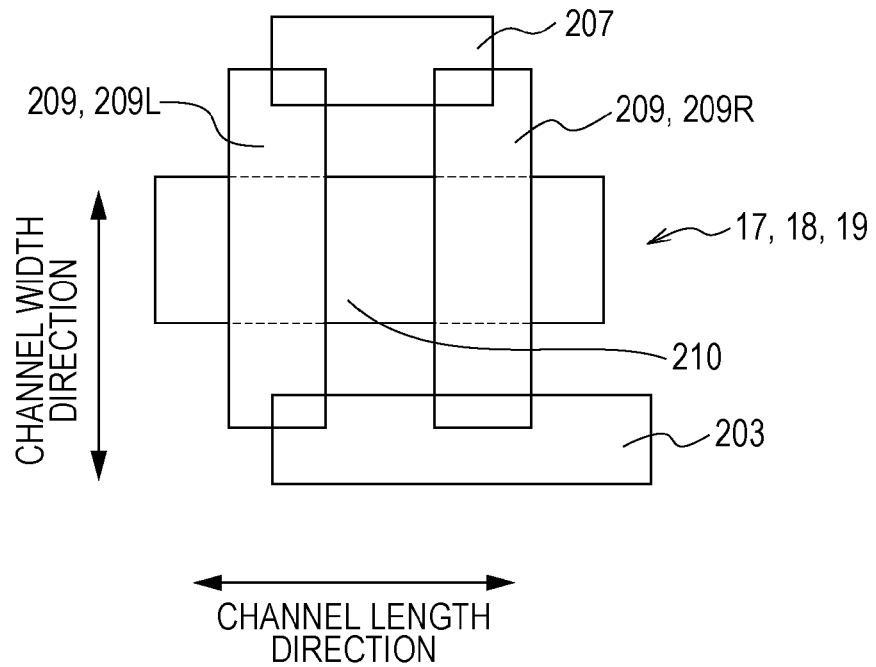
FIGS. 5A-5B are diagrams schematically illustrating masks used in manufacturing of an image apparatus.
Figure 5B:
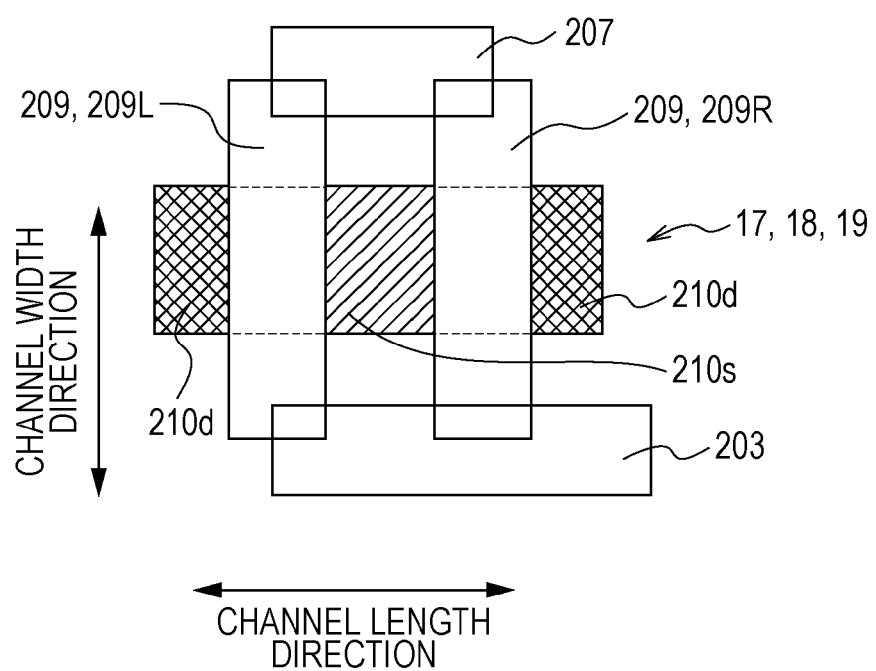

Next, planar structures of the first through third masks 17-19 and relative positions thereof will be explained. FIGS. 5A and 5B are diagrams schematically illustrating the first through third masks 17-19 used in the steps illustrated in FIGS. 4A-4C. Elements of FIGS. 5A-5B corresponding to those illustrated in any of FIGS. 4A through 4C are designated by the same reference numerals as FIGS. 4A through 4C.

Each of FIGS. 5A and 5B illustrates the first opening 209, the second opening 210 and the third openings 203 and 207. FIG. 5B distinguishes each part of the second opening 210. In the present embodiment, each of the first opening 209, the second opening 210 and the third openings 203 and 207 has a rectangular shape. The first mask 17 which defines the first opening 209 is indicated as an area outside a rectangle indicating the opening 209. The second mask 18 which defines the second opening 210 is indicated as an area outside a rectangle indicating the second opening 210. The third mask 19 which defines the third openings 203 and 207 is indicated as an area outside a rectangle indicating the third openings 203 and 207.

For ease of explanation, the first through third openings 209, 210, 203 and 207 are illustrated to overlap with each other in FIGS. 5A and 5B, whereby indicates alignments between the masks. However, the mask may be removed after forming the corresponding semiconductor region in each step. Accordingly, two or more masks are not necessarily provided at the same time.

The first opening 209 and the second opening 210 intersect each other when viewed in a planar view. In other words, an orthogonal projection of the first opening 209 onto a plane parallel to the surface of the semiconductor substrate 100 intersect an orthogonal projection of the second opening 210 onto the plane.

As illustrated in FIG. 5B, the second opening 210 includes a source-side portion 210s and a drain-side portion 210d. The source-side portion 210s of the second opening 210 corresponds to the source-side portion 10s of the channel region 10. The drain-side portion 210d of the opening 210 corresponds to the drain-side portion 10d of the channel region 10. In FIG. 5B, there are two drain-side portions 210d: one is a part on left side of the first opening 209L, the other is a part on right side of the first opening 209R.

Each of the source-side portion 210s and the drain-side portion 210d of the second opening 210 overlaps with the first mask 17 when viewed in a planar view. In other words, each of an orthogonal projection of the source-side portion 210s onto a plane parallel to the surface of the semiconductor substrate 100 and an orthogonal projection of the drain-side portion 210d onto the plane overlaps with an orthogonal projection of the first mask 17 onto the plane. Accordingly, as illustrated in FIG. 5, the channel length of the JFET is defined by the ends of the first opening 209. The channel width of the JFET is defined by the ends of the second opening 210.

According to the above described configuration, even though there could be alignment errors between the first mask 17 used to form the gate region 9 and the second mask 18 used to form the channel region 10, a shape of the channel of the JFET is almost steady, or unchanged. Thus, fluctuations in the channel length and the channel width of the JFET may be reduced. As a result, fluctuations in the characteristic of the JFET may be reduced.

In the present embodiment, the first opening includes a plurality of openings 209L and 209R which are divided by the first mask 17. Each of the openings 209L and 209R intersects the second opening 210 when viewed in a planar view. In other words, each of orthogonal projections of the plurality of the opening 209L and 209R onto a plane parallel to the surface of the semiconductor substrate 100 intersects the orthogonal projection of the second opening 210. The source-side portion 210s of the second opening 210 overlaps with the first mask 17, specifically, with a part of the first mask 17 which is arranged, located, positioned, or disposed between the two openings 209L and 209R, when viewed in a planar view.

The first opening 209 partially overlap with the third openings 203 and 207 when viewed in a planar view. In other words, the orthogonal projection of the first opening 209 onto a plane parallel to the surface of the semiconductor substrate 100 partially overlaps with the orthogonal projections of the third openings 203 and 207 onto the plane.

According to the above described configuration, the effective channel width of the JFET may be widened. That is to say, the drive capability of the JFET may be improved. Thus, the imaging apparatus may operate at a high speed.

The entirety of the second opening 210 is overlapped with the third mask 19 when viewed in a planar view. In this configuration, it is possible to reduce amount of impurities doped into the channel region 10 when doping the semiconductor substrate 100 with impurities using the third mask 19. Accordingly, even though the P-type semiconductor region that electrically connects the gate regions 9 is formed, fluctuations in the electrical characteristic of the JFET may be reduced.

In the present embodiment, the region that forms the channel of the JFET includes the N-type semiconductor region 22 and the drain-side portion 10d of the channel region 10. The impurity density of the drain-side portion 10d of the channel region 10 is lower than the impurity density of the N-type semiconductor region 22. In another aspect, in the region that forms the channel of the JFET, an impurity density profile is formed such that the impurity density is getting lower as it goes toward a direction to which a carrier in the channel drifts. According to the above described configuration, the electric field in the vicinity of the drain of the JFET may be alleviated. Hereinafter, the alleviation of the electric field will be described in detail with reference to the drawings.

Figure 6A:
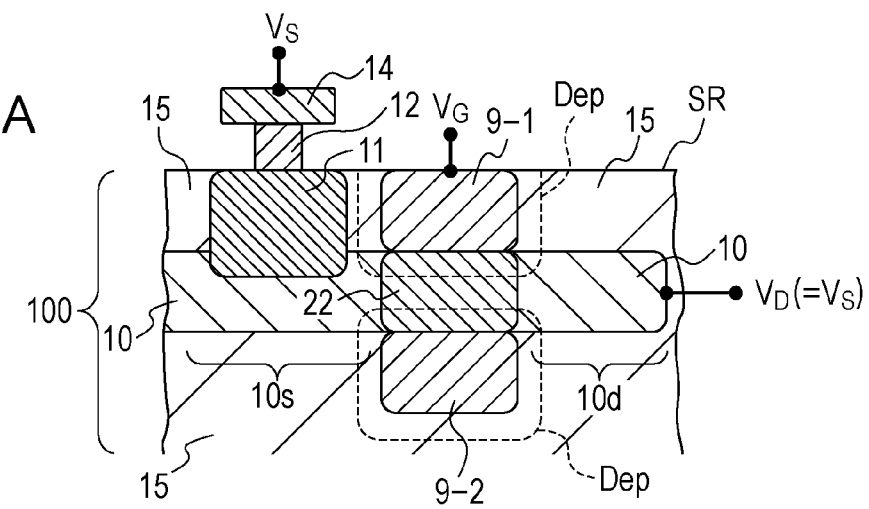
FIG. 6A is a diagram schematically illustrating a cross sectional structure of an imaging apparatus.
Figure 6B:
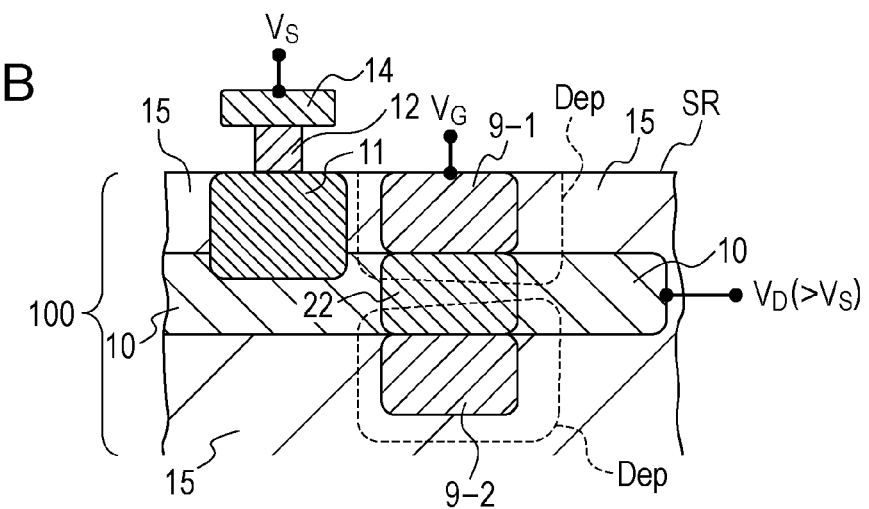
FIG. 6B is a diagram schematically illustrating a cross sectional structure of an imaging apparatus.
Figure 6C:
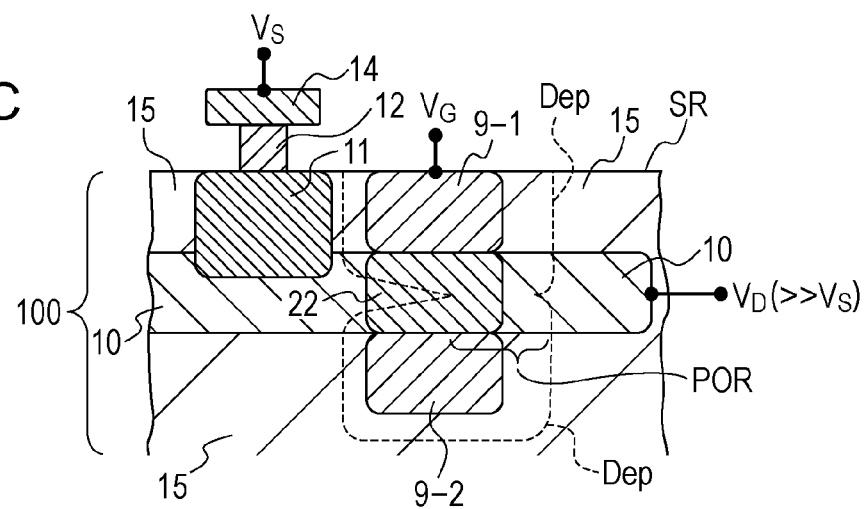
FIG. 6C is a diagram schematically illustrating a cross sectional structure of an imaging apparatus.

FIGS. 6A-6C schematically illustrate a part of the cross sectional structure of the JFET illustrated in FIG. 2, respectively. Elements of FIGS. 6A-6C corresponding to those illustrated in FIG. 2 are designated by the same reference numerals as FIG. 2. In FIGS. 6A-6C, a depletion layer DEP from the gate region 9 is illustrated. The shape of the depletion layer DEP is schematic in FIG. 6. Actually, the depletion layer DEP has a shape that depends on the impurity profile.

FIG. 6A schematically illustrates a shape of the depletion layer DEP when the source voltage Vs and the drain voltage Vd are equal. FIG. 6B schematically illustrates a shape of the depletion layer DEP when the drain voltage Vd is higher than the source voltage Vs. FIG. 6C schematically illustrates a shape of the depletion layer DEP when the difference between the drain voltage Vd and the source voltage Vs becomes larger than that in FIG. 6B.

As illustrated in FIG. 6B, as the drain voltage Vd becomes higher, the expansion of the depletion layer DEP on the drain side becomes larger. Accordingly, a depletion layer from the surface gate region 9-1 and a depletion layer from the buried gate region are getting close to each other. When the difference between the drain voltage Vd and the source voltage Vs becomes large to the certain extent, the depletion layer from the surface gate region 9-1 and the depletion layer from the buried gate region become spatially continuous, or merge, as illustrated in FIG. 6C. Thus, a pinch off region POR is generated in the vicinity of the drain region.

In a state illustrated in FIG. 6B, a neutral region continues from the drain region to the source region through the N-type semiconductor region that forms the channel. Accordingly, when a voltage is applied between the drain and the source, a potential having a gentle gradient is formed between the drain region and the source region. However, when the pinch off region POR is generated, most of the drain-source voltage is applied between the pinch off region POR. In other words, a large, or intensive, electric field is generated in the pinch off region POR.

If a large electric field is generated in the vicinity of the drain of the JFET, the carriers in the channel cause impact-ionization at the vicinity of the drain, and thus, generate electron-hole pairs. The generated electron or hole may run into the gate region 9 or the photo electric conversion unit that accumulates signal carriers, whereby noise may be generated. The alleviation of the electrical field around the drain of the JFET may prevent the impact-ionization which causes a noise. As a result, noises in the pixel may be reduced.

Generally, the channel current of the JFET causes the impact-ionization in a pinch-off region near the drain region. Accordingly, in order to alleviate the electrical field of the pinch-off region and prevent the impact-ionization, it is advantageous to make an impurity density of the drain region low. However, the pinch off region may be generated in most of the channel, depending on the drain-source voltage. Thus, when at least part of the channel has an impurity density profile where the impurity density is getting lower as it goes toward a direction to which the carrier drifts, the electric field may be alleviated.

In the present embodiment, the channel of the JFET may be formed by only the N-type semiconductor region 22 without forming the channel region 10. In this case, a part of the N-type semiconductor region 15 forms the drain region. Without the channel region 10, the channel width of the JFET is defined as a distance between the FD region 3 and the source region 7 of the reset MOS transistor along the channel width direction.

Figure 7A:
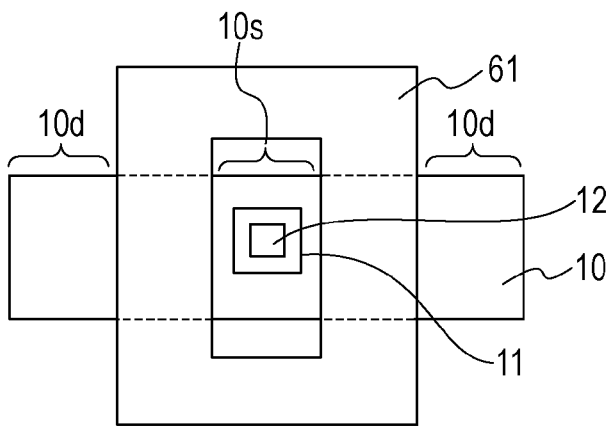
FIG. 7A is a diagram schematically illustrating a planar structure of an imaging apparatus.

Here, a variation of the present embodiment will be explained. FIG. 7A is a diagram schematically illustrating a planar structure of an imaging apparatus of the present embodiment. A JFET is illustrated in FIG. 7A. Elements of FIG. 7A corresponding to those illustrated in FIG. 1 are designated by the same reference numerals as FIG. 1. The structure of the imaging apparatus is similar to the first embodiment except for those explained otherwise.

One of the features of the present embodiment is a shape of a gate region 61 of the JFET. Specifically, the gate region 61 surrounds the source-side portion 10s of the channel region 10 when viewed in a planar view. Two parts of the gate region 61 respectively intersect the channel region 10 when viewed in a planar view. Each of the source-side region 10s and the drain-side region 10d of the channel region 10 does not overlap with the gate region 61. Each of the source-side region 10s and the drain-side region 10d protrudes out of the gate region 61. Accordingly, the channel length of the JFET is defined by the end of the gate region 61. The channel width of the JFET is defined by the end of the channel region 10.

According to the above described configuration, even though there could be alignment errors between a mask used to form the gate region 61 and a mask used to form the channel region 10, a shape of the channel of the JFET is almost steady, or unchanged. Thus, fluctuation in the channel length and the channel width of the JFET may be reduced. As a result, fluctuations in the characteristic of the JFET may be reduced.

In the variation illustrated in FIG. 7A, the gate region 61 is spatially continuous. The surface gate region and the buried gate region is electrically connected to each other via a connecting portion which does not overlap with the channel region 10 when viewed in a planar view. Thus, the effective channel width of the JFET may be widened while omitting the step to form the semiconductor region having the same conductivity type as the two gate regions and connecting the two gate regions. For example, a step to form the FD region 3 shown in FIG. 1 may be omitted.

Figure 7B:
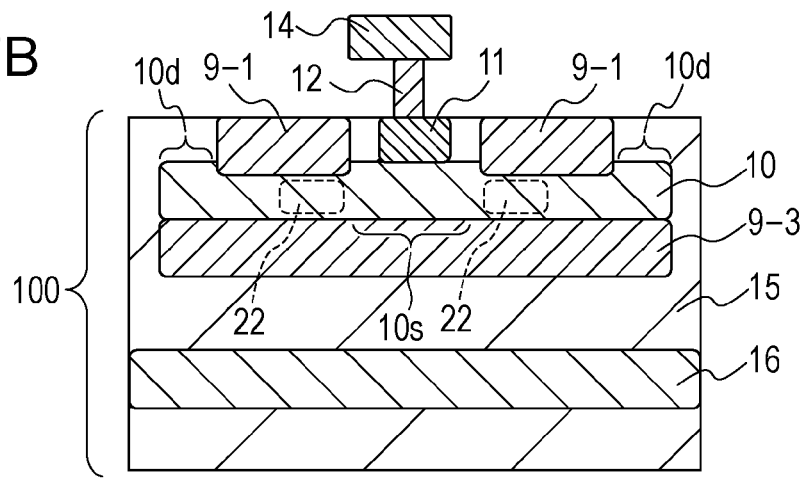
FIG. 7B is a diagram schematically illustrating a cross sectional structure of an imaging apparatus.

Here, another variation will be explained. FIG. 7B is a diagram schematically illustrating a cross sectional structure of an imaging apparatus of the present embodiment. A JFET is illustrated in FIG. 7B. Elements of FIG. 7B corresponding to those illustrated in FIG. 1 are designated by the same reference numerals as FIG. 1. The structure of the imaging apparatus is similar to the first embodiment except for those explained otherwise.

In the JFET illustrated in FIG. 7B, the gate region 9 includes a surface gate region 9-1 and a buried gate region 9-3. The buried gate region 9-3 includes a P-type semiconductor region having, in a planar view, a different shape from that of the surface gate region 9-1. The buried gate region 9-3 is electrically connected to the surface gate region 9-1. In FIG. 7B, the planar shape of the buried gate region 9-3 is identical to the planar shape of the channel region 10. Or, the buried gate region 9-3 may contain completely the channel region 10 when viewed in a planar view.

In the JFET illustrated in FIG. 7B, the N-type semiconductor region of a high impurity density is arranged, located, positioned, or disposed only in the vicinity of the source. At least a part of the region that forms the channel may have am impurity density profile such that the impurity density is getting lower from the source region to the drain region.

Figure 7C:
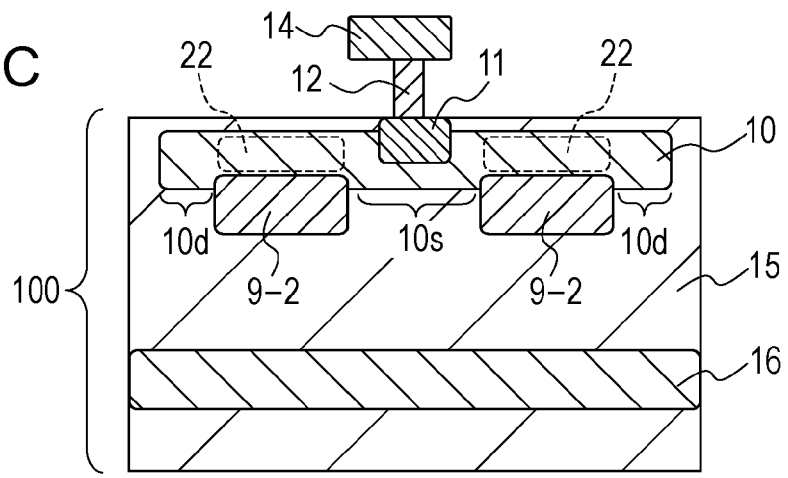
FIG. 7C is a diagram schematically illustrating a cross sectional structure of an imaging apparatus.

Here, another variation will be explained. FIG. 7C is a diagram schematically illustrating a cross sectional structure of an imaging apparatus of the present embodiment. A JFET is illustrated in FIG. 7C. Elements of FIG. 7C corresponding to those illustrated in FIG. 1 are designated by the same reference numerals as FIG. 1. The structure of the imaging apparatus is similar to the first embodiment except for those explained otherwise. The gate region 9 of the JFET illustrated in FIG. 6C only includes the buried gate region 9-2.

In these variations, the impact-ionization is reduced. Accordingly, noises may be reduced.

As described above, according to some of the embodiments, noises may be reduced.

Second Embodiment

Now, another embodiment will be described. Difference with the first embodiment is that a structure to reduce a parasitic JFET current is provided under the source region of the JFET. The explanation will focus on the differences with the first embodiment, and the explanation on the same structure as the first embodiment will be omitted.

Figure 8:
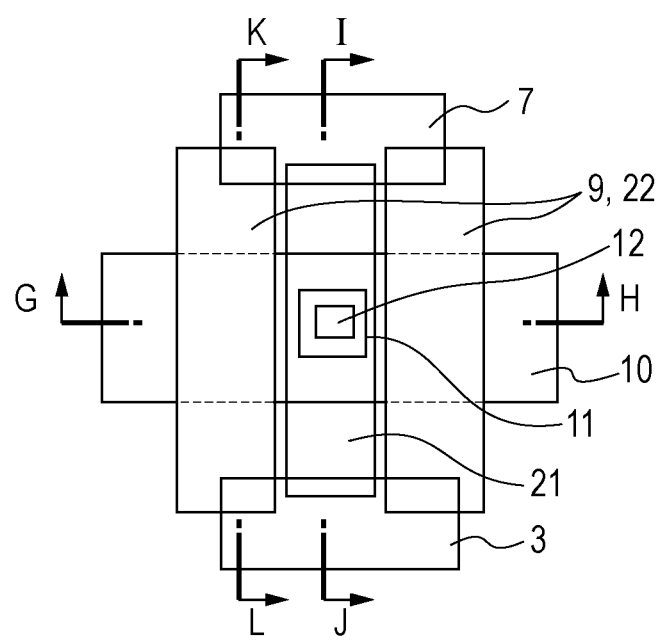
FIG. 8 is a diagram schematically illustrating a planar structure of an imaging apparatus.

FIG. 8 is a diagram schematically illustrating a planar structure of an imaging apparatus of the present embodiment. A JFET is illustrated in FIG. 8. Elements of FIG. 8 corresponding to those illustrated in FIG. 1 are designated by the same reference numerals as FIG. 1.

The pixel of the present embodiment includes a P-type semiconductor region 21. The semiconductor region 21 overlaps with the source region 11 when viewed in a planar view. In other words, an orthogonal projection of the P-type semiconductor region 21 onto a plane parallel to the surface of the semiconductor substrate overlaps with an orthogonal projection of the source region 11 onto the plane. The p-type semiconductor region 21 is arranged, located, positioned, or disposed between the two gate regions 9 when viewed in a planar view. In other words, the orthogonal projection of the P-type semiconductor region 21 onto the plane parallel to the surface of the semiconductor substrate is located between the orthogonal projections of the two gate regions 9 onto the plane.

Figure 9A:
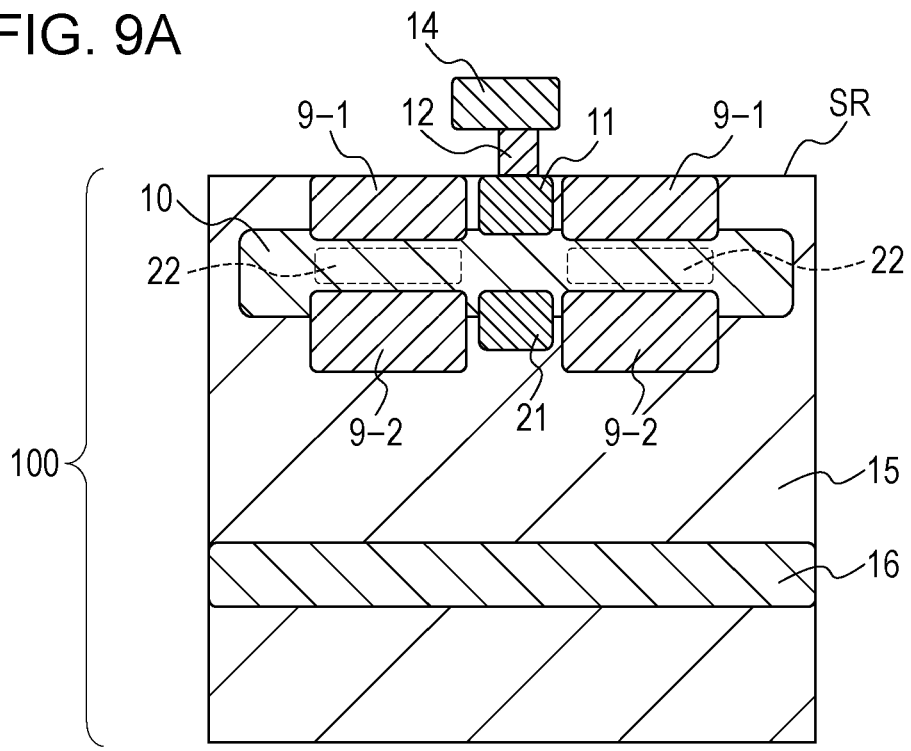
FIG. 9A is a diagram schematically illustrating a cross sectional structure of an imaging apparatus.

FIG. 9A is a diagram schematically illustrating a cross sectional structure of the imaging apparatus of the present embodiment. FIG. 9A schematically illustrates the cross sectional structure along a line G-H in FIG. 8. Elements of FIG. 9A corresponding to those illustrated in any of FIGS. 1 through 8 are designated by the same reference numerals as FIGS. 1 through 8.

As illustrated in FIG. 9A, the P-type semiconductor region 21 is arranged, located, positioned, or disposed at a deeper position than the channel region 10. When the P-type semiconductor region 21 and the channel region 10 are formed by ion implantations, a peak in an impurity density profile along a depth direction of the P-type semiconductor region 21 is located at a deeper position than a peek in an impurity density profile along the depth direction of the channel region 10. The depth direction is defined as a vertical direction to the surface SR.

In the present embodiment, the entirety of the P-type semiconductor region 21 is arranged, located, positioned, or disposed at the same depth as the buried gate region 9-2. In FIG. 9A, the P-type semiconductor region 21 and the buried gate region 9-2 are electrically connected to each other. The P-type semiconductor region 21 and the buried gate region 9-2 may be formed spatially continuously.

Figure 9B:
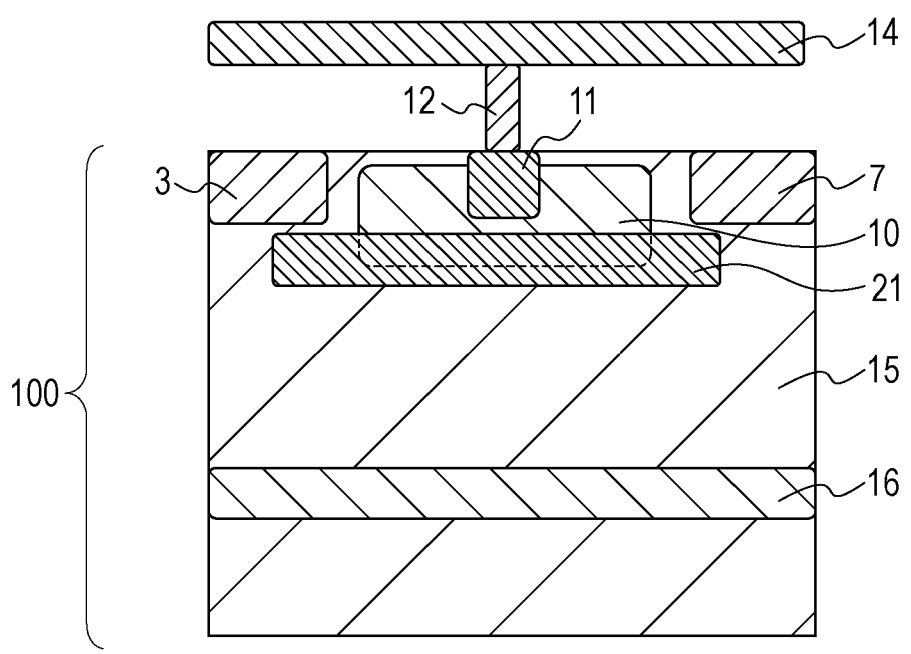
FIG. 9B is a diagram schematically illustrating a cross sectional structure of an imaging apparatus.

FIG. 9B is a diagram schematically illustrating a cross sectional structure of the imaging apparatus of the present embodiment. FIG. 9B schematically illustrates the cross sectional structure along a line I-J in FIG. 8. Elements of FIG. 9B corresponding to those illustrated in any of FIGS. 1 through 8 are designated by the same reference numerals as FIGS. 1 through 8.

As illustrated in FIG. 9B, the P-type semiconductor region 21 is wider than the channel region 10 in the channel width direction. In the present embodiment, P-type semiconductor region 21 extends to the extent that the P-type semiconductor region 21 reaches a region directly under the FD region 3 and a region directly under the source region 7 of the reset MOS transistor.

The cross sectional structure along a line K-L in FIG. 8 is the same as those of the first embodiment. That is to say, FIG. 3B schematically illustrates the cross sectional structure of the present embodiment.

According to the above described configuration, electrical resistance between the channel region 10 and the N-type semiconductor region 15 may be high. As a result, it is possible to reduce a parasitic current which runs through a region other than the channel defined by the gate region 9 and the channel region 10. Since the dependency of the parasitic current on the gate voltage is low, a large parasitic current may deteriorate the current-voltage characteristic of the JFET. Thus, reducing the parasitic current may improve the current-voltage characteristic of the JFET.

An impurity density of the P-type semiconductor region 21 may be lower than that of the buried gate region 9-2. In this configuration, even though there could be alignment error when forming the P-type semiconductor region 21, fluctuations in the electrical characteristic of the JFET may be reduced.

A manufacturing method of the imaging apparatus of the present embodiment further includes a step to form the P-type semiconductor region 21 in addition to the method explained in the first embodiment. The P-type semiconductor region 21, for example, may be formed by using a mask illustrated in FIG. 8.

As described above, according to the present embodiment, the parasitic JFET current may be reduced in addition to obtaining technical effect of the first embodiment.

Third Embodiment

Figure 11:
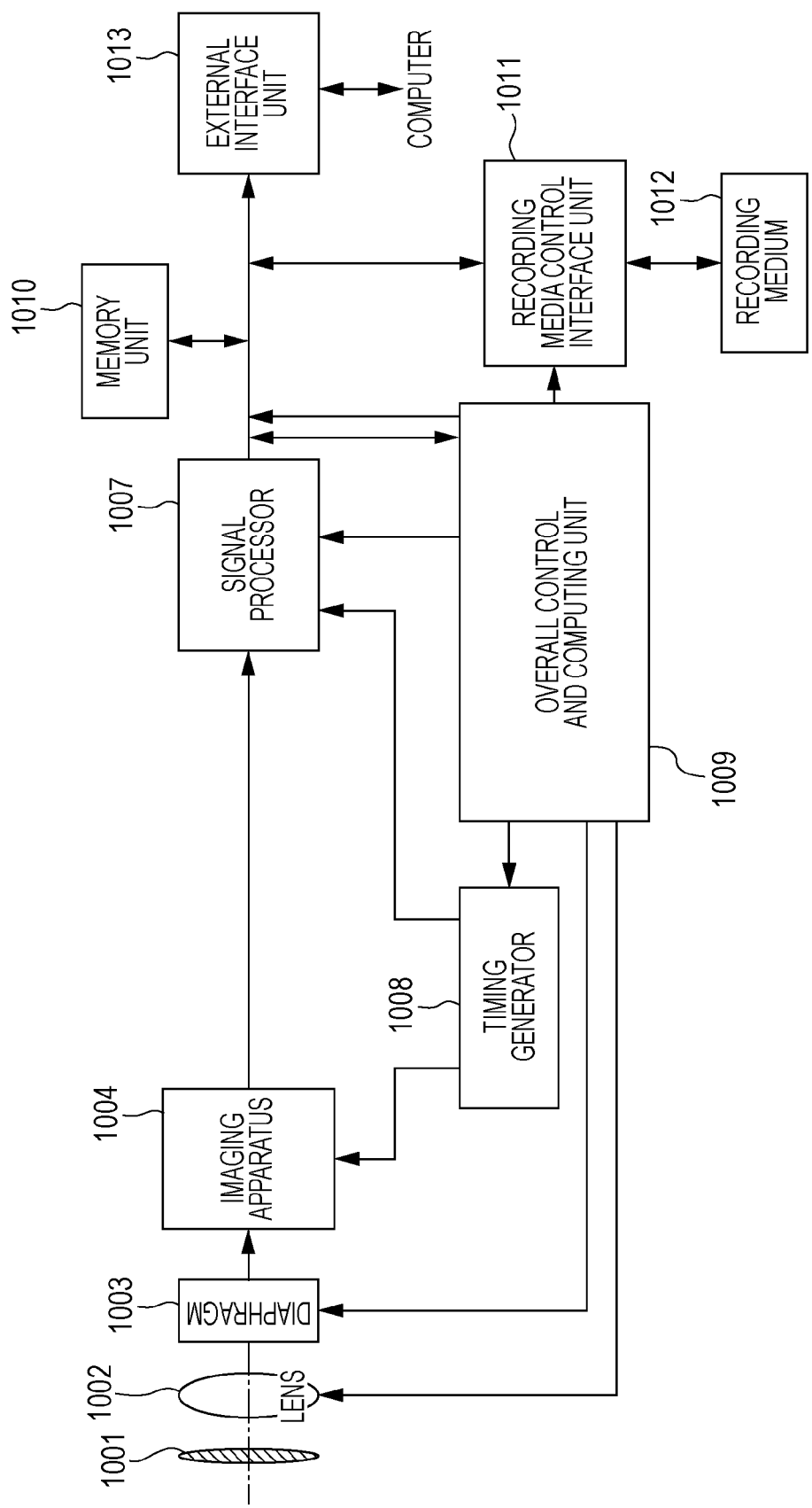
FIG. 11 is a block diagram of an imaging system.

An imaging system according to an embodiment of the present disclosure will be described. Examples of the imaging system include digital still cameras, digital camcorders, copiers, facsimiles, mobile phones, in-vehicle cameras, and orbiting satellites. FIG. 11 illustrates a block diagram of a digital still camera serving as an example of the imaging system.

In FIG. 11, a reference numeral 1001 denotes a barrier for lens protection, 1002 denotes a lens causing the imaging apparatus 1004 to perform focusing on an optical image of a photographic subject, and 1003 denotes a diaphragm configured to change the amount of light passing through the lens 1002. A reference numeral 1004 denotes an imaging apparatus described in the above embodiments, and is configured to convert the optical image formed by the lens 1002 as image data. Now, let us say that an AD conversion unit is formed on a semiconductor substrate of the imaging apparatus 1004. A reference numeral 1007 denotes a signal processor configured to subject imaged data output by the imaging apparatus 1004 to various types of correction or to compress the imaged data. In FIG. 11, a reference numeral 1008 denotes a timing generator configured to output various types of timing signals to the imaging apparatus 1004 and signal processor 1007, and 1009 denotes an overall control unit configured to control the entire digital still camera. A reference numeral 1010 denotes a frame memory unit configured to temporarily store image data, 1011 denotes an interface unit configured to perform recording or readout on a recording medium, and 1012 denotes a recoding medium capable of connecting to and disconnecting from the imaging apparatus 1004, such as semiconductor memory or the like, configured to preform recording or readout of imaged data. Also, a reference numeral 1013 denotes an interface unit configured to communicate with an external computer or the like. Here, a timing signal or the like may be input from the outside of the imaging system. The imaging system has to include at least the imaging apparatus 1004, and the signal processor 1007 configured to process the imaged signal output from the imaging apparatus 1004.

A configuration has been described in the present embodiment wherein the imaging apparatus 1004 and AD conversion unit are provided to a different semiconductor substrate. However, the imaging apparatus 1004 and AD conversion unit may be formed on the same semiconductor substrate. Also, the imaging apparatus 1004 and signal processor 1007 may be formed on the same semiconductor substrate.

Also, the signal processor 1007 may be configured to process a signal based on an electric carrier generated at the first photoelectric conversion unit, and a signal based on an electric carrier generated at the second photoelectric conversion unit to obtain distance information from the imaging apparatus 1004 to a subject.

The imaging apparatus according to one of the first embodiment and the second embodiment is employed as the imaging apparatus 1004 in the imaging system according to the present embodiment. Thus, noises may be reduced by applying an embodiment of the present disclosure to an imaging system.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2013-267137 filed Dec. 25, 2013, which is hereby incorporated by reference herein in its entirety.

What is claimed is:

1. An imaging apparatus comprising:
a photoelectric conversion unit;
a junction type field effect transistor configured to output a signal based on a carrier generated by the photoelectric conversion unit; and
a semiconductor substrate where the photoelectric conversion unit and the junction type field effect transistor are provided,
wherein
the junction type field effect transistor includes a semiconductor region of a first conductivity type that forms a channel and a gate region of a second conductivity type,
the semiconductor region of the first conductivity type includes a first region and a second region, the first region and the second region being disposed in this order toward a direction to which a carrier in the channel drifts,
an impurity density of the second region is lower than an impurity density of the first region, and
an orthogonal projection of the first region onto a plane parallel to a surface of the semiconductor substrate overlaps with an orthogonal projection of the gate region onto the plane.

2. The imaging apparatus according to claim 1, wherein the second region is included in a drain region of the junction type field effect transistor.

3. The imaging apparatus according to claim 1, further comprising:
a semiconductor substrate where the photoelectric conversion unit and the junction type field effect transistor are provided,
wherein
an orthogonal projection of the semiconductor region of the first conductivity type onto a plane parallel to a surface of the semiconductor substrate intersects an orthogonal projection of the gate region onto the surface.

4. The imaging apparatus according to claim 1, wherein
the junction type field effect transistor includes a source region of the first conductivity type, and
the gate region includes a plurality of sub-regions which are arranged to sandwich the source region and are electrically connected to each other.

5. The imaging apparatus according to claim 1, wherein
the gate region includes a surface gate region and a buried gate region disposed at different depths from each other, and
the semiconductor region of the first conductivity type is disposed between the surface gate region and the buried gate region.

6. The imaging apparatus according to claim 5, wherein
the junction type field effect transistor includes a source region of the first conductivity type, and
at least part of the source region is disposed at a position shallower than the semiconductor region of the first conductivity type and at a same depth as the surface gate region.

7. An imaging apparatus comprising:
a photoelectric conversion unit; and
a junction type field effect transistor configured to output a signal based on a carrier generated by the photoelectric conversion unit,
wherein
the junction type field effect transistor includes a channel region of a first conductivity type, a source region of the first conductivity type, a drain region of the first conductivity type and a gate region of a second conductivity type,
the channel region includes a first region and a second region, the first region and the second region being disposed in this order from the source region to the drain region,
an impurity density of the second region is lower than an impurity density of the first region,
the gate region includes a surface gate region and a buried gate region disposed at different depths from each other, and
the channel region is disposed between the surface gate region and the buried gate region.

8. The imaging apparatus according to claim 7, further comprising:
a semiconductor substrate where the photoelectric conversion unit and the junction type field effect transistor are provided,
wherein
an orthogonal projection of the channel region onto a plane parallel to a surface of the semiconductor substrate overlaps with an orthogonal projection of the gate region onto the plane, and
an orthogonal projection of the drain region onto the plane does not overlaps with the orthogonal projection of the gate region onto the plane.

9. The imaging apparatus according to claim 7, wherein
the gate region includes a plurality of sub-regions which are disposed to sandwich the source region and are electrically connected to each other,
the channel region is divided correspondingly to the sub-regions, and
an impurity density of the drain region is lower than an impurity density of a region under the sub-region.

10. The imaging apparatus according to claim 7, wherein
at least part of the source region is disposed at a position shallower than the channel region and at a same depth as the surface gate region.

11. An imaging system comprising:
the imaging apparatus according to claim 1; and
a signal processing unit configured to process a signal output from the imaging apparatus.

12. An imaging system comprising:
the imaging apparatus according to claim 7; and
a signal processing unit configured to process a signal output from the imaging apparatus.

\* \* \* \* \*